United States Patent
Ye et al.

(10) Patent No.: US 7,839,644 B2
(45) Date of Patent: Nov. 23, 2010

(54) FIXING APPARATUS FOR HEAT SINK

(75) Inventors: Zhen-Xing Ye, Shenzhen (CN); Xiao-Zhu Chen, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 8 days.

(21) Appl. No.: 12/420,814

(22) Filed: Apr. 8, 2009

(65) Prior Publication Data

US 2010/0177485 A1    Jul. 15, 2010

(30) Foreign Application Priority Data

Jan. 13, 2009   (CN) .................... 2009 1 0300156

(51) Int. Cl.
H05K 7/20 (2006.01)
H01L 23/34 (2006.01)
F28F 7/00 (2006.01)

(52) U.S. Cl. .................. 361/719; 257/719; 165/185

(58) Field of Classification Search ......... 257/718–719; 361/719–720
See application file for complete search history.

(56) References Cited

U.S. PATENT DOCUMENTS

| 5,464,054 | A | * | 11/1995 | Hinshaw et al. | 165/80.3 |
| 6,229,703 | B1 | * | 5/2001 | Lee | 361/704 |
| 6,243,265 | B1 | * | 6/2001 | Wong et al. | 361/704 |
| 6,731,506 | B1 | * | 5/2004 | Dong et al. | 361/719 |
| 7,142,429 | B2 | * | 11/2006 | Hsieh et al. | 361/710 |
| 7,277,288 | B2 | * | 10/2007 | Lee et al. | 361/704 |
| 7,342,791 | B2 | * | 3/2008 | Lee et al. | 361/704 |
| 2006/0198107 | A1 | * | 9/2006 | Azar et al. | 361/704 |
| 2008/0174952 | A1 | * | 7/2008 | Ye et al. | 361/687 |
| 2008/0192427 | A1 | * | 8/2008 | Wu et al. | 361/687 |

* cited by examiner

Primary Examiner—Gregory D Thompson
(74) Attorney, Agent, or Firm—Zhigang Ma

(57) ABSTRACT

A fixing apparatus is provided for retaining a heat sink to a circuit board. The fixing apparatus includes a mount fixed to the circuit board, two locking members attached to the mount, and a clip. The mount defines a receiving hole accommodating the heat sink. The clip includes a positioning portion abutting against the heat sink, and two retaining arms extending from opposite ends of the positioning portion. The positioning portion presses the heat sink against the circuit board in response to the retaining arms engaging with the locking members.

11 Claims, 5 Drawing Sheets

FIXING APPARATUS FOR HEAT SINK

BACKGROUND

1. Technical Field

The present disclosure relates to fixing apparatuses and, more particularly, to a fixing apparatus for securing a heat sink to a circuit board.

2. Description of Related Art

A heat sink is usually placed in thermal contact with an electronic component, such as a south bridge or a north bridge, and transfers heat through conduction away from the electronic component so as to prevent over-heating of the electronic component. Usually, the heat sink is secured to the electronic component via a clip. The heat sink includes a base and a plurality of fins extending from the base. A plurality of grooves is defined between adjacent fins. The clip spans across one of the grooves in the middle of the heat sink, and abuts against the base of the heat sink. Two hooks are formed at opposite ends of the clip and respectively engaging with two locking members fixed to the circuit board, thereby securing the heat sink to the circuit board.

When the heat sink is secured to the circuit board, the placement orientation of the heat sink relative to the circuit board is determined by positions of the locking members. Typically, the placement orientation of the heat sink is unchangeable, because the locking members are fixed to the circuit board. Therefore, the layout design of the circuit board will be inflexible and inconvenient.

DETAILED DESCRIPTION

Figure 1:
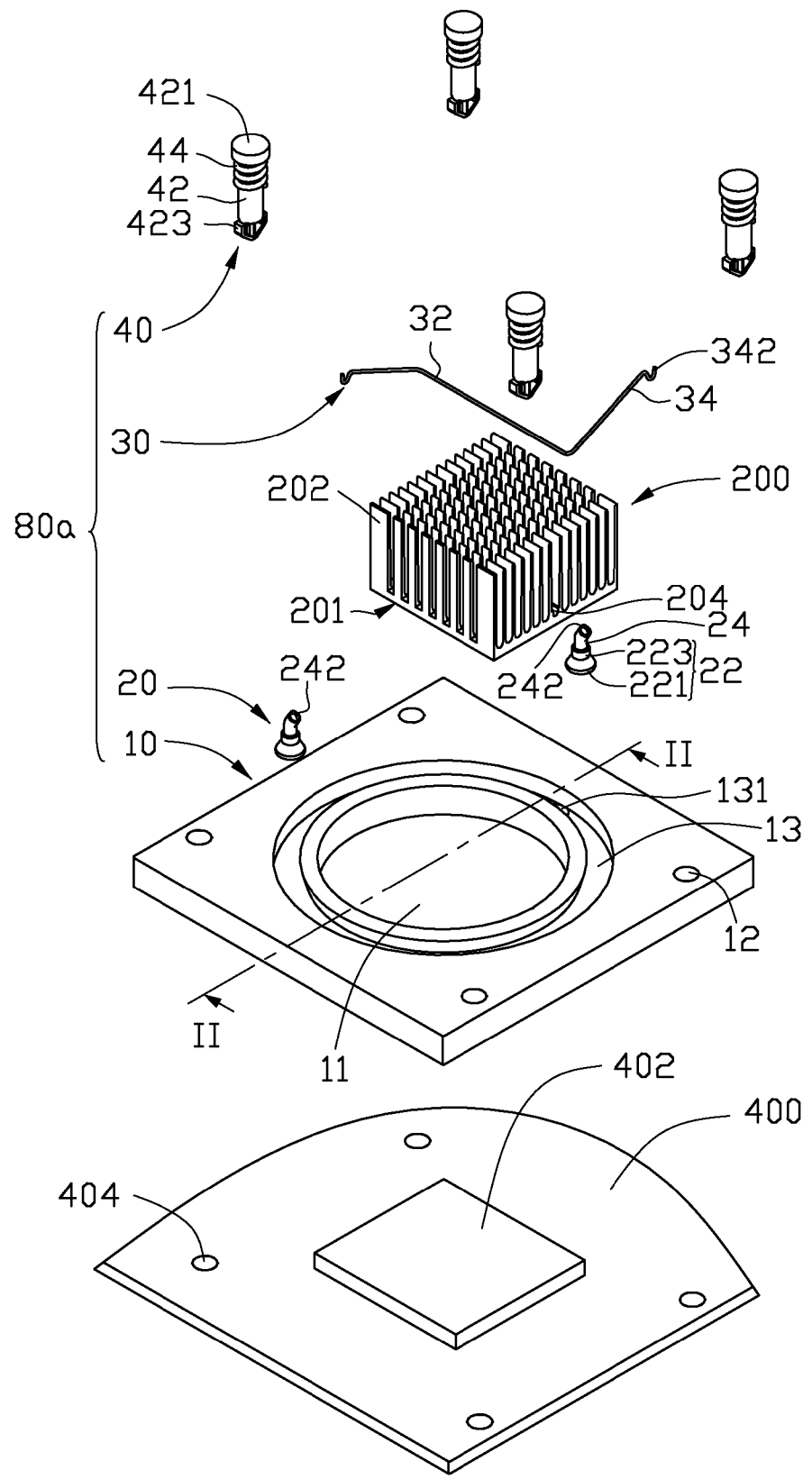
FIG. 1 is an exploded, isometric view of a first exemplary embodiment of a fixing apparatus together with a heat sink and a circuit board, the fixing apparatus includes a mount.

Referring to FIG. 1, a first exemplary embodiment of a fixing apparatus is provided for retaining a heat sink 200 to a circuit board 400. The fixing apparatus includes a mount 10, two locking members 20, a clip 30, and four fasteners 40.

The heat sink 200 includes a base 201 and a plurality of parallel fins 202 extending from a first surface of the base 201. A receiving slot 204 is defined between two adjacent fins 202, located in a middle of the first surface of the base 201.

An electronic component 402 is attached to the circuit board 400. Four spaced fixing holes 404 are defined in the circuit board 400 and arranged around the electronic component 402.

Figure 2:
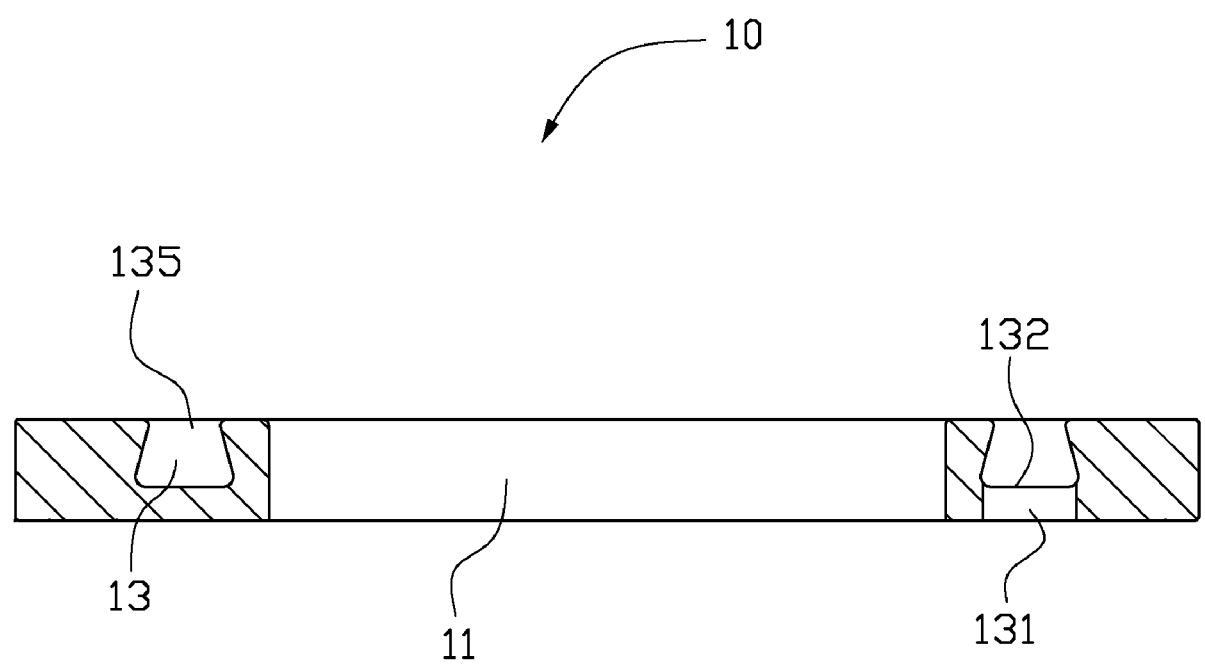
FIG. 2 is a cross-sectional view of the mount taken along the line II-II of FIG. 1.

Referring to FIG. 2, in the first exemplary embodiment, the mount 10 is a square-shaped plate, with a round receiving hole 11 defined in a center of the mount 10. Four securing holes 12 are defined in four corners of the mount 10. The mount 10 further defines an annular mounting slot 13 surrounding the receiving hole 11. The mounting slot 13 defines a trapezoidal cross section, and includes a bottom 132, an opening 135 opposite to the bottom 132. A width of the opening 135 is smaller than a width of the bottom 132. An access hole 131 is defined in the bottom 132 of the mounting slot 13 and communicates with the mounting slot 13.

Figure 3:
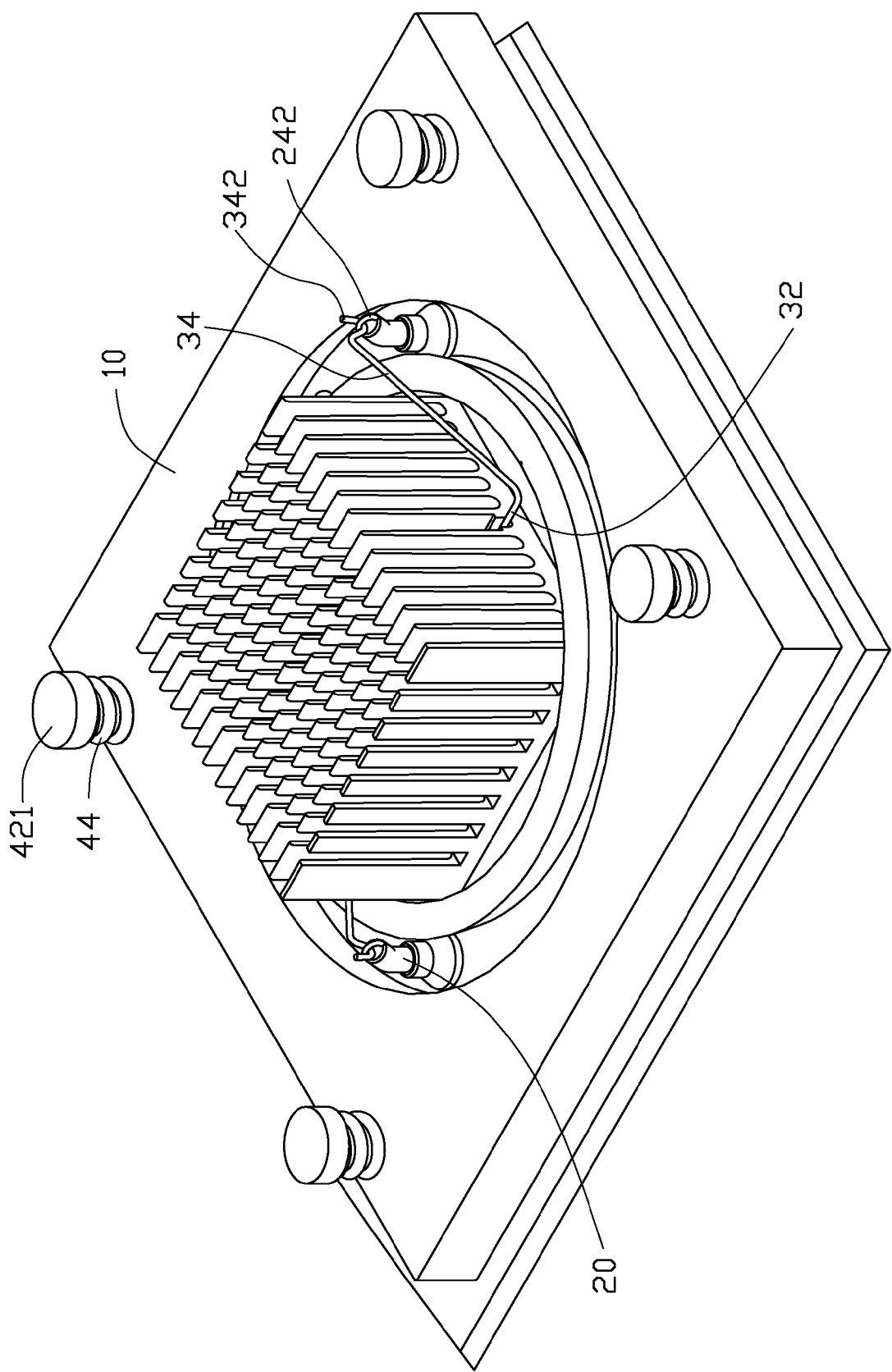
FIG. 3 is an assembled, isometric view of the fixing apparatus, the heat sink, and the circuit board of FIG. 1.

Referring to FIGS. 2 and 3, each locking member 20 includes a support 22 and a locking portion 24 extending up from the support 22. The support 22 includes a tapered portion 221, and a connecting portion 223 extending from a small end of the tapered portion 221 and connected to a first end of the locking portion 24. A diameter of a large end of the tapered portion 221 is smaller than a diameter of the access hole 131, but greater than the width of the opening 135 of the mounting slot 13. A locking ring 242 is formed at a second end of the locking portion 24 opposite to the support 22.

The clip 30 is formed from a resilient metal bar. The clip 30 includes a pole-shaped positioning portion 32, and two retaining arms 34 slantingly extending from opposite ends of the positioning portion 32 away from each other. Each retaining arm 34 forms a catch 342 at a distal end opposite to the positioning portion 32.

The fasteners 40 are used to secure the mount 10 to the circuit board 400. The fasteners 40 can be screws, rivets or other common connecting means. In the first exemplary embodiment, each of the fasteners 40 includes a pin 42 and a coil spring 44 placed around the pin 42. The pin 42 includes a cap 421 at a first end of the pin 42, and a resilient tapered stopping portion 423 at a second end of the pin 42 opposite to the cap 421.

Figure 4:
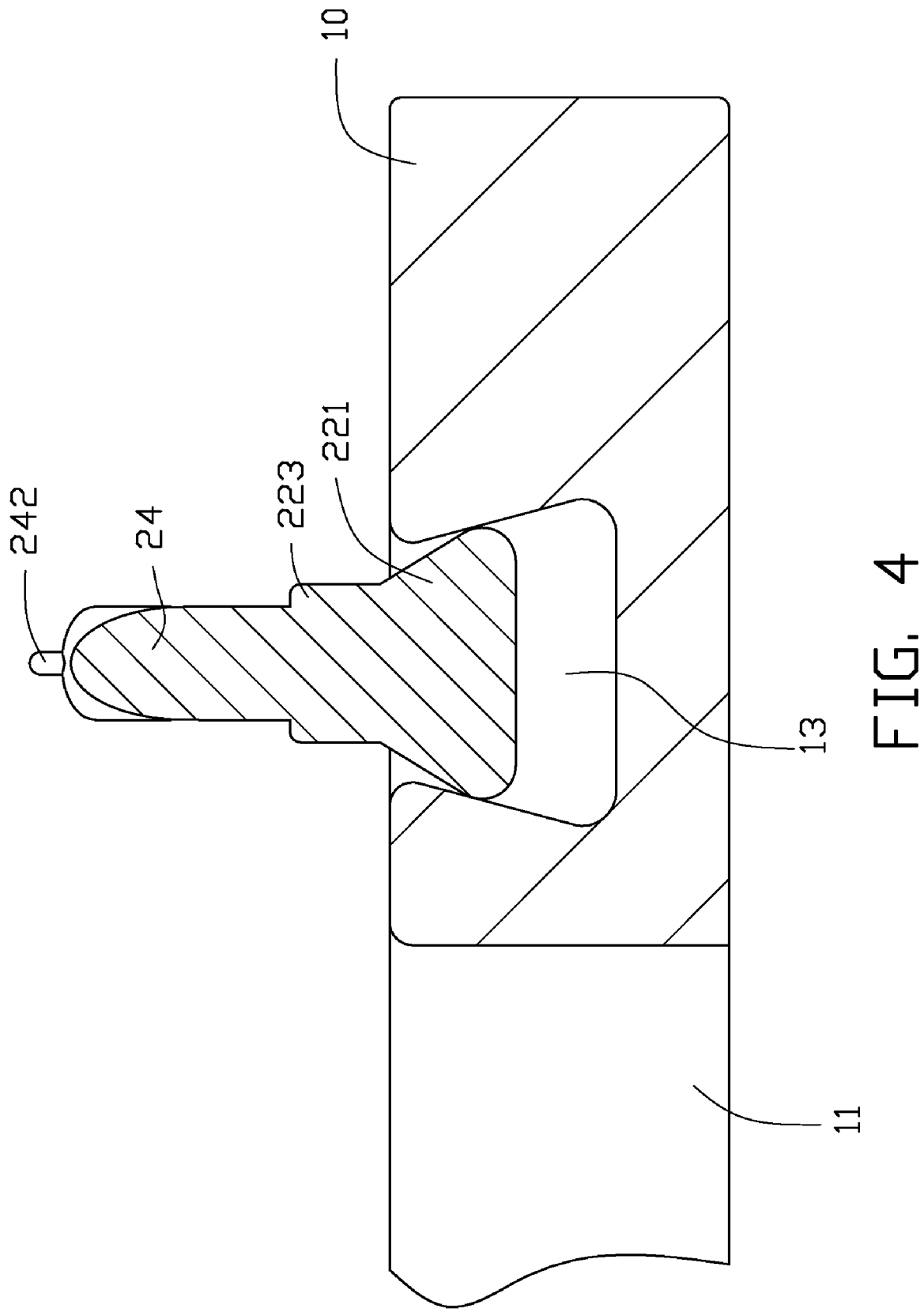
FIG. 4 is partially cutaway view of FIG. 3.

Referring to FIGS. 3 and 4, in assembly, the two locking members 20 are inserted into the mounting slot 13 via the access hole 131 from a bottom of the mount 10. The locking members 20 can be prevented from disengage from the mount 10, because the diameter of the large end of the tapered portion 221 of each locking member 20 is greater than the width of the opening 135 of the mounting slot 13.

The mount 10 is placed on the circuit board 400, with the securing holes 12 of the mount 10 aligning with the fixing holes 404 of the circuit board 400. The electronic component 402 is received in the receiving hole 11 of the mount 10. The pin 42 of one of the fasteners 40 is driven towards the circuit board 400, and the stopping portion 423 is squeezed through the corresponding one of securing holes 12 of the mount 10 and the corresponding fixing hole 404 of the circuit board 400. Therefore, the stopping portion 423 of the fastener 40 is clasped to a surface of the circuit board 400 opposite to the mount 10 by the action of the coil spring 44 of the fastener 40 resisting against the cap 421 of the pin 42. Other fasteners 40 are installed to the mount 10 one by one according to an aforementioned way. Therefore, the mount 10 is secured to the circuit board 400.

The heat sink 200 is moved to pass through the receiving hole 11 of the mount 10, and positioned on the electronic component 402, with a second surface of the base 201 opposite to the fins 202 abutting against the electronic component 402. The positioning portion 32 of the clip 30 is retained in the receiving slot 204 of the heat sink 200. The locking members 20 are slid along the mounting slot 13 until the locking members 20 are generally in alignment with the corresponding catches 342 of the clip 30. The two retaining arms 34 of the clip 30 are deformed toward the heat sink 200 to engage the catches 342 of the clip 30 into the locking rings 242 of respective locking members 20. Then, the two retaining arms 34 are released and restored. Therefore, the catches 342 of the clip 30 are retained in the locking rings 242, and the heat sink 200 tightly resist against the electronic component of the circuit board 400 via the position portion 32.

Figure 5:
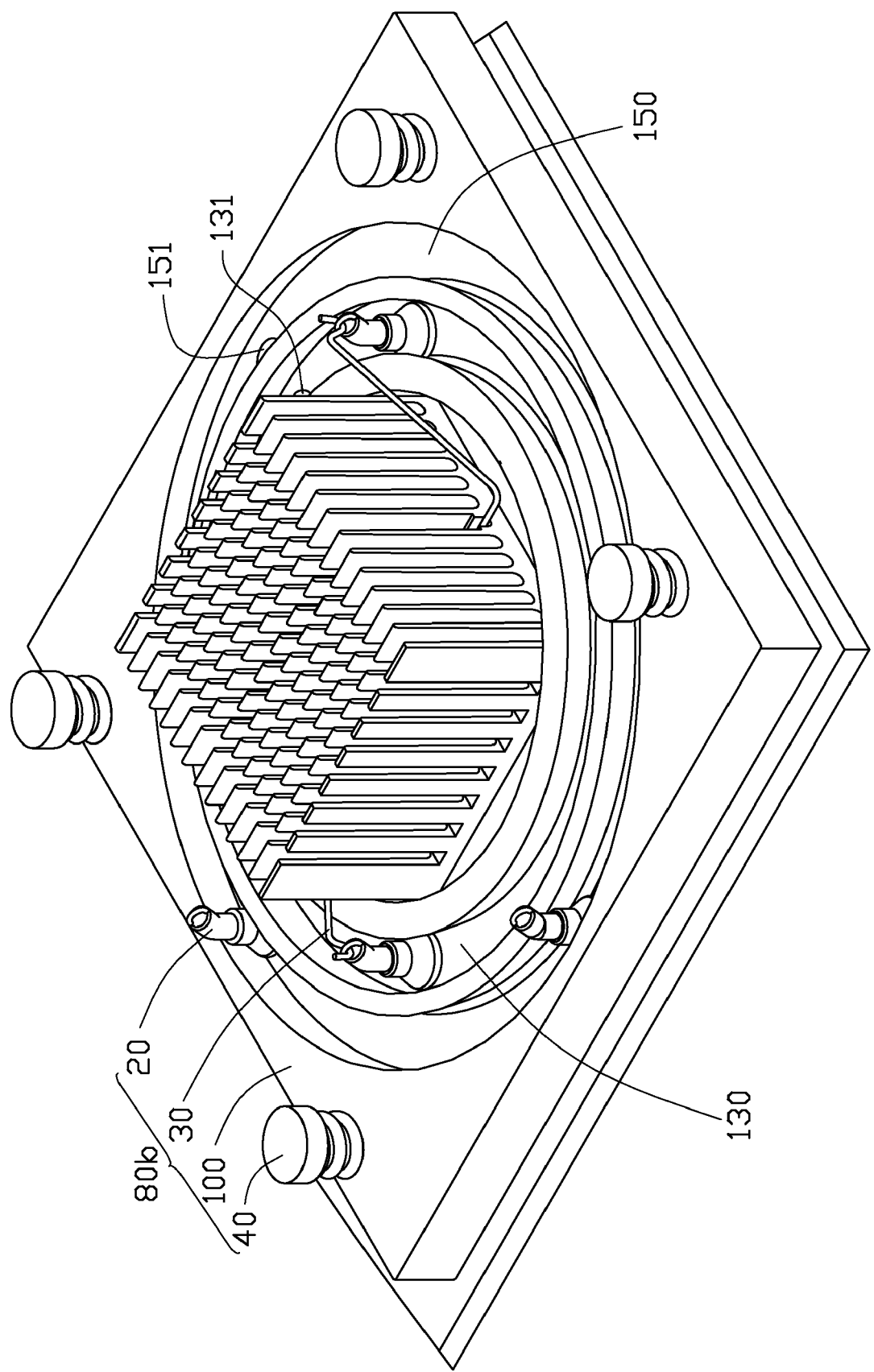
FIG. 5 is an assembled, isometric view of a second exemplary embodiment of a fixing apparatus, a heat sink, and a circuit board.

Referring to FIG. 5, a second exemplary embodiment of a fixing apparatus includes four locking members 20 and a mount 100 similar to the mount 10 of the first exemplary embodiment, but defines two annular mounting slots 130 and 150, which are concentric with each other. Bottoms of the mounting slots 130 and 150 respectively define an access hole 131 and 151. Two of the locking members 20 are inserted into the mounting slot 130 via the access hole 131, the other two of the locking members 20 are insert into the mounting slot 150 via the access hole 151. In assembly, the locking members 20 slidably received in the respective mounting slots 131 and 151 can be in response to clips with different lengths. Therefore, more convenience and flexibility are achieved.

It is to be understood, however, that even though numerous characteristics and advantages of the present disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A fixing apparatus for retaining a heat sink to a circuit board, the fixing apparatus comprising:
    a mount fixed to the circuit board and defining a receiving hole accommodating the heat sink;
    two locking members attached to the mount; and
    a clip comprising a positioning portion abutting against the heat sink, and two retaining arms extending from opposite ends of the positioning portion and corresponding to the two locking members, respectively;
    wherein the positioning portion resists the heat sink against the circuit board in response to the two retaining arms respectively engaging with the corresponding locking members;
    wherein the mount defines an annular mounting slot surrounding the receiving hole, the mounting slot slidably receives and retains the locking members.

2. The fixing apparatus as claimed in claim 1, wherein an opening of the mounting slot is defined in a surface of the mount opposite to the circuit board, the opening has a width smaller than a width of a bottom of the mounting slot, each of the locking members comprises a support disposed between the bottom and the opening of the mounting slot.

3. The fixing apparatus as claimed in claim 2, wherein an access hole is defined in a surface forming the bottom of the mounting slot, for the locking members being able to be inserted into the mounting slot.

4. The fixing apparatus as claimed in claim 2, wherein the mounting slot defines a trapezoidal cross section with two slanting sides connection between the bottom and the opening of the mounting slot.

5. The fixing apparatus as claimed in claim 2, wherein each of the locking members comprises a locking portion extending from the support towards the opening of the mounting slot, the locking portions respectively engagable with the retaining arms of the clip.

6. The fixing apparatus as claimed in claim 5, wherein two locking rings are respectively formed at distal ends of the locking portions of the locking members, two catches are respectively formed at distal ends of the retaining arms of the clip, to be respectively retained in the locking rings of the locking members.

7. The fixing apparatus as claimed in claim 1, wherein the clip is formed from a resilient metal bar.

8. A heat sink assembly for heat dissipating of an electronic component mounted on a circuit board, the heat sink assembly comprising:
    a heat sink configured for abutting against the electronic component; and
    a mount configured to be fixed to the circuit board adjacent to the electronic component and the heat sink;
    wherein the mount defines a receiving hole extending through two opposite surfaces of the mount to accommodate the heat sink, and a plurality of annular mounting slots surrounding the receiving hole, each of the mounting slots slidably receives and retains two locking members;
    a clip comprising a positioning portion abutting against the heat sink, and two retaining arms extending from the positioning portion, wherein the heat sink is retained to the circuit board in response to the two retaining arms respectively engaging with the two locking members of a selected one of the mounting slots.

9. The heat sink assembly as claimed in claim 8, wherein the positioning portion of the clip is pole-shaped, and the retaining arms extend from opposite ends of the positioning portion, and respectively engage with the two locking members received in the selected one of the mounting slots.

10. The heat sink assembly as claimed in claim 9, wherein each of the mounting slots forms an opening and a bottom, the opening has a width smaller than a width of the bottom, each of the locking members comprises a support adapted to be limited between the opening and the bottom.

11. The heat sink assembly as claimed in claim 10, wherein the bottom of each of the mounting slots defines an access hole, to enable the corresponding two of the locking members to be inserted therein.

* * * * *